United States Patent
Kim et al.

(10) Patent No.: US 6,475,886 B2
(45) Date of Patent: Nov. 5, 2002

(54) FABRICATION METHOD OF NANOCRYSTALS USING A FOCUSED-ION BEAM

(75) Inventors: Eun Kyu Kim, Seoul (KR); Young Ju Park, Seoul (KR); Tae Whan Kim, Seoul (KR); Seung Oun Kang, Seoul (KR); Dong Chul Choo, Uijeongbu-shi (KR); Jae Hwan Shim, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 10/025,696

(22) Filed: Dec. 26, 2001

(65) Prior Publication Data

US 2002/0081848 A1 Jun. 27, 2002

(30) Foreign Application Priority Data

Dec. 26, 2000 (KR) ......................................... 2000-82009

(51) Int. Cl.[7] ............................................. H01L 21/425
(52) U.S. Cl. ....................................... 438/515; 438/535
(58) Field of Search ................................. 438/515, 522, 438/535, 540, 545

(56) References Cited

U.S. PATENT DOCUMENTS 5,474,591 A    12/1995  Wells et al.
5,637,258 A     6/1997  Goldburt et al.
5,679,962 A  * 10/1997  Kizuki .......................... 257/17

* cited by examiner

Primary Examiner—Chandra Chaudhari
Assistant Examiner—Jack Chen
(74) Attorney, Agent, or Firm—Oliff & Berridge, PLC

(57) ABSTRACT

Disclosed is a method for forming a nano-crystal. In the above method, there is prepared a substrate having a metal film or a semiconductor film formed thereon. A focused-ion beam is irradiated onto a plurality of positions on a surface of the metal film or the semiconductor film, whereby the metal film or the semiconductor film is removed at a focal portion of the focused-ion beam but an atomic bond in the metal film or the semiconductor film is broken at an overlapping region of the focused-ion beams due to an radiation effect of the focused-ion beam to form the nano-crystal. The method allows a few nm or less-sized nano-crystals to be formed with ease and simplicity using the focused-ion beam. As a result, the formed nano-crystals come to have a binding energy capable of restraining thermal fluctuation phenomenon at room temperature and thereby it becomes possible to fabricate a tunneling transistor capable of being operated at room temperature. Further, the invention contributes largely to a development of next generation ultra high density memory device with a memory capacitance of tera byte level or more.

1 Claim, 2 Drawing Sheets

FABRICATION METHOD OF NANOCRYSTALS USING A FOCUSED-ION BEAM

BACKGROUND OF THE INVENTION

1. Field of the Invention

The present invention relates to a fabrication method of nano-crystals, and more particularly, to a fabrication method of nano-crystals serving as a coulomb island at the room temperature using a focused-ion beam (FIB).

2. Description of the Related Art

In the fabrication of a single electron tunneling transistor (SET) or a quantum device for a next generation-high memory integrated circuit, it is a problem of great urgency and essentiality to form nano-crystals for electron binding. In order for the nano-crystals to bind tunnel electrons at room temperature, sizes of the nano-crystals for binding the electrons should be a few ten nm or less such that the nano-crystals have a binding force of greater than the thermal fluctuation energy of the electrons at the room temperature.

At the present, there is mostly being used a growing method in order to form the nano-crystals or quantum island. However, there are several problems in applying this growing method to a real process because of a complicated process and a difficult control of the growing method.

In the meanwhile, a focused-ion beam system is a system used in repairing an integrated circuit or a maskless lithography and its technical development reaches a level capable of directly processing an ultra fine structure of a unit of micron ($\mu$m) or less based on the development of liquid metal ion source.

However, there is not yet any try to form the nano-crystals using the focused-ion beam technology.

SUMMARY OF THE INVENTION

Accordingly, it is an object of the present invention to provide a method for fabricating nano-crystals serving as coulomb island at room temperature using a focused-ion beam.

To accomplish the above object and other advantages, there is provided a method for forming a nano-crystal. In the above method, there is prepared a substrate having a metal film or a semiconductor film formed thereon. A focused-ion beam is irradiated onto a plurality of positions on a surface of the metal film or the semiconductor film, whereby the metal film or the semiconductor film is removed at a focal portion of the focused-ion beam but an atomic bond in the metal film or the semiconductor film is broken at an overlapping region of the focused-ion beams due to an radiation effect of the focused-ion beam to form the nano-crystal.

BRIEF DESCRIPTION OF THE DRAWINGS

The above objects and other advantages of the present invention will become more apparent by describing preferred embodiments thereof in detail with reference to the attached drawings in which.

DETAILED DESCRIPTION OF THE PREFERRED EMBODIMENTS

Hereinafter, preferred embodiments of the present invention will be described in detail with reference to the accompanying drawings.

Figure 1A:
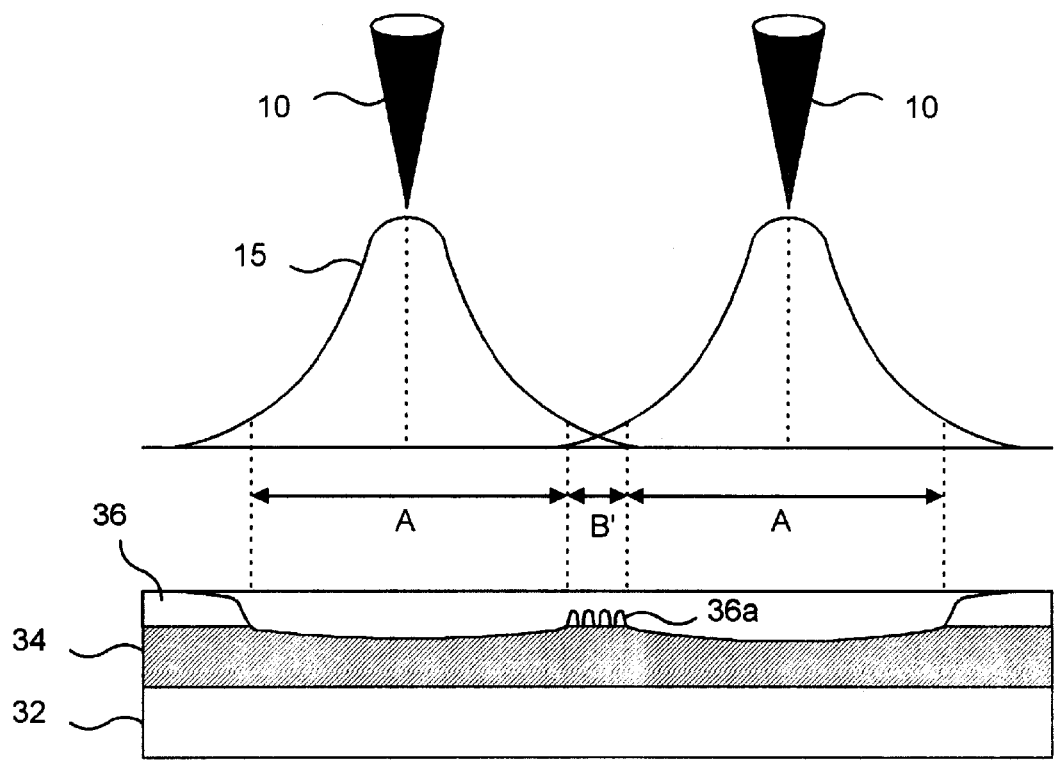
FIGS. 1A to 1B are schematic views for describing a method for forming a nano-crystal in accordance with one preferred embodiment of the present invention.
Figure 1B:
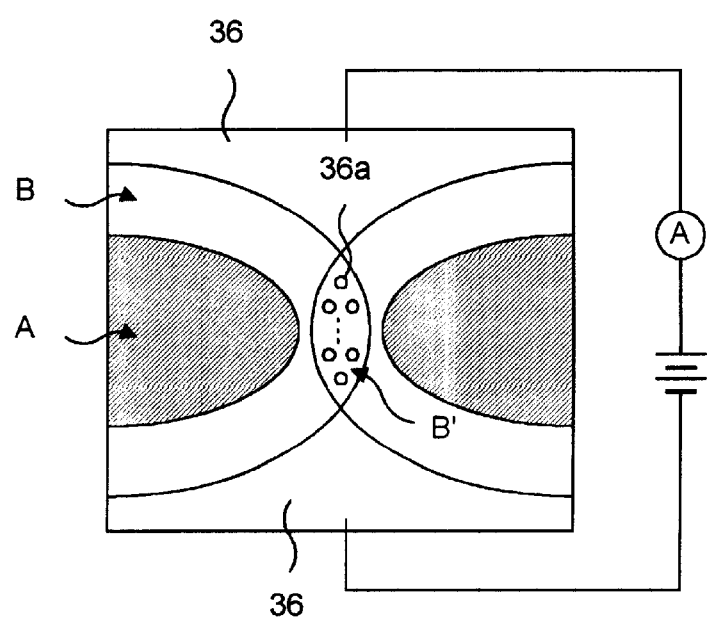

FIGS. 1A and 1B are schematic views for describing a method for forming a nano-crystal in accordance with one preferred embodiment of the present invention. Specifically, FIG. 1A is a sectional view and FIG. 1B is a plan view.

Referring to FIGS. 1A and 1B, an insulating layer 34 and a metal layer 36 are sequentially formed on a substrate 32. For instance, an MgO layer and an Al layer are sequentially stacked on a p-type silicon substrate. Alternatively, dopants-doped polycrystalline silicon can be used instead of the metal layer 36.

Energy density of an ion beam has Gaussian distribution as indicated by a numeral 15 in FIG. 1A. Thus, if a focused-ion beam is irradiated onto two positions of a surface of the metal layer 36 through a focused-ion beam probe 10, the metal layer 36 are completely removed at a focal portion on which the ion beam is focused in the metal layer 36, whereby a completely removed region "A" is formed, while the metal layer 36 is not completely removed but is partially removed in the vicinity of the focal portion, whereby a partially removed region "B" appears.

At the partially removed region "B" of the metal layer 36 are partially broken atomic bonds due to the radiation effect of the focused-ion beam, so that partial defects are generated. These defects vary with the energy density of the focused-ion beam that is, implanted into the metal layer 36 as a workpiece, the focused degree, the irradiation time, etc.

Especially, this phenomenon occurs more frequently at an overlapped portion of the focused-ion beams. Therefore, if the implantation of the focused-ion beams are carried out in some degree, a nano-crystal region (B') that is a group region of nano-crystals 36a is formed due to a bond breaking in atomic structure.

If the irradiation time further elapses, even the nano-crystal 36a is etched away, so that the density of the nano-crystal region (B') grows less and less. To this end, it is important to control the irradiation time such that the nano-crystal region (B') maintains a proper density.

Crystallization of nano-crystals 36a is carried out by a secondary electron generated by an impact between the ions of the focused ion beam and atoms of the workpiece or other factor.

Whether or not nano-crystals are formed can be confirmed through two ways. One is to inspect electrical properties after applying a tunnel current to the nano-crystal region (B') as shown in FIG. 1B and the other is to directly observe such nano-crystals using a high magnification electron microscope.

Figure 2:
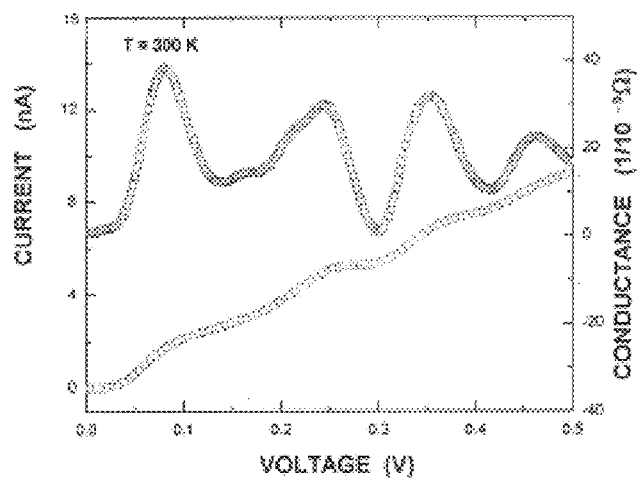
FIG. 2 is a graph showing electrical properties results measured when a tunnel current is applied to a nano-crystal region (B')

FIG. 2 is a graph showing electrical properties results measured, when a tunnel current is applied to a nano-crystal region (B'). In FIG. 2, a graph indicated by a reference numeral 100 is a current-voltage curve when a voltage is applied to the metal layer 36 positioned at both sides of the nano-crystal region (B') and a tunnel current flowing through the nano-crystal region (B') is measured. A graph indicated by a reference numeral 200 is a voltage-conductivity curve.

Referring to FIG. 2, it is shown that the current-voltage curve 100 has a step form and the voltage-conductivity curve 200 has a fluctuation in the conductivity. This is due to coulomb blockade phenomenon, and is a result indirectly showing that a few ten nm or less-sized nano-crystal region 36a was formed.

Figure 3:
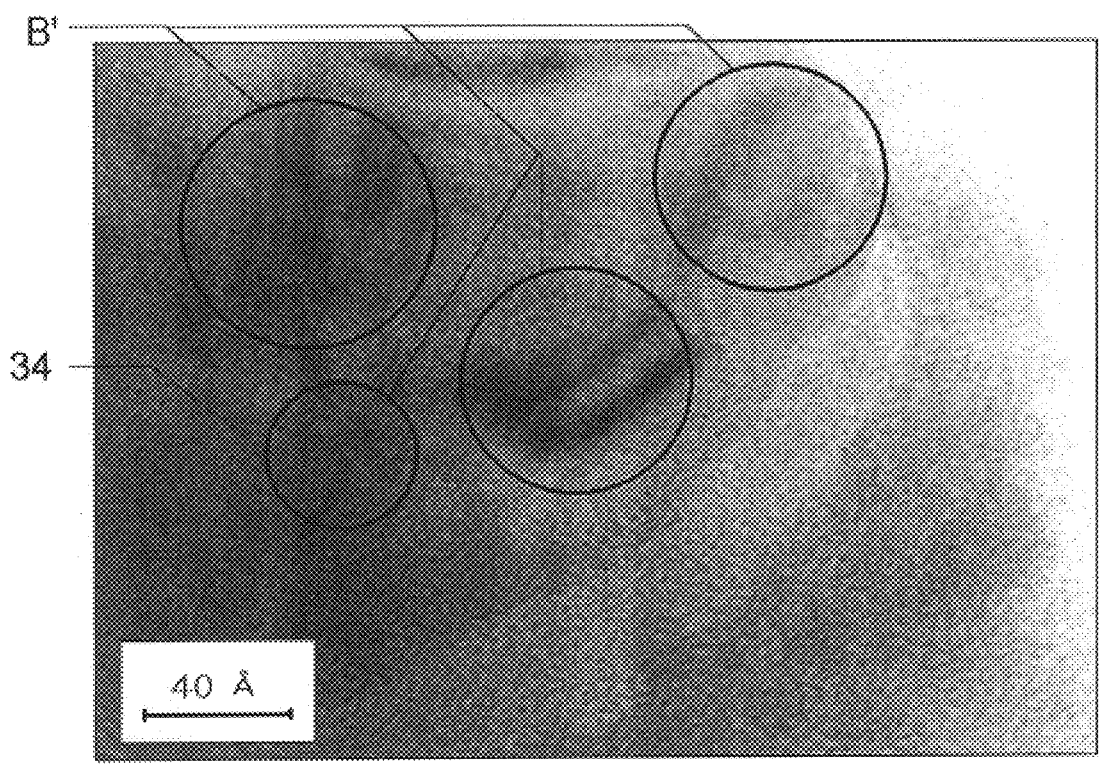
FIG. 3 is a photograph of the nano-crystal region (B') obtained by a TEM of a high magnification.

FIG. 3 is a photograph of the nano-crystal region (B') obtained by a TEM (Transmission electron microscope) of a high magnification From the result of FIG. 3, it is well known that a distance between the nanocrystals is approximately 10 Å. Accordingly, tunnel current is generated even at a relatively low bias voltage and coulomb blockade phenomenon that is a quantum effect of a single electron transistor is also generated at room temperature.

As described previously, the forming method of nano-crystals in accordance with the present invention allows a few nm or less-sized nano-crystals to be formed with ease and simplicity using the focused-ion beam. As a result, the formed nano-crystals come to have a binding energy capable of restraining thermal fluctuation phenomenon at room temperature and thereby it becomes possible to fabricate a tunneling transistor capable of being operated at room temperature. Further, the invention contributes largely to a development of next generation ultra high density memory device with a memory capacitance of tera byte level or more.

While the present invention has been described in detail, it should be understood that various changes, substitutions and alterations can be made hereto without departing from the spirit and scope of the invention as defined by the appended claims.

What is claimed is:

1. A method for fabricating a nano-crystal, the method comprising the steps of:

preparing a substrate having a metal film or a semiconductor film formed thereon; and irradiating a focused-ion beam onto a plurality of positions on a surface of the metal film or the semiconductor film, whereby the metal film or the semiconductor film is removed at a focal portion of the focused-ion beam but an atomic bond in the metal film or the semiconductor film is broken at an overlapping region of the focused-ion beams due to an radiation effect of the focused-ion beam to form the nano-crystal.

* * * * *